United States Patent [19]
Guarracini et al.

[11] Patent Number: 4,572,021
[45] Date of Patent: Feb. 25, 1986

[54] MOTION TRANSMISSION SYSTEM

[75] Inventors: Joseph Guarracini, Lawrenceville; Paul E. Shepherd, Lambertville; Robert W. McQuade, Princeton, all of N.J.

[73] Assignee: RCA Corporation, Princeton, N.J.

[21] Appl. No.: 657,170

[22] Filed: Oct. 3, 1984

[51] Int. Cl.$^4$ .................. G05G 11/00; F16D 3/06; F16B 7/10
[52] U.S. Cl. .................. 74/479; 74/531; 403/104; 403/379; 411/479; 464/162
[58] Field of Search .......... 74/479, 531; 403/104, 403/378, 379; 464/162; 411/479

[56] References Cited

U.S. PATENT DOCUMENTS

| | | | |
|---|---|---|---|
| 2,648,247 | 8/1953 | Schmuziger | 85/8.3 |
| 3,057,173 | 10/1962 | Varden | 464/162 |
| 3,187,521 | 6/1965 | Morris et al. | 464/162 X |
| 3,270,591 | 9/1966 | Winter, IV | 77/64 |
| 3,549,182 | 12/1970 | Bogue et al. | 287/52.08 |
| 4,406,641 | 9/1983 | Mallet | 464/162 |

Primary Examiner—Allan D. Herrmann
Attorney, Agent, or Firm—Joseph S. Tripoli; George E. Haas; William Squire

[57] ABSTRACT

An electron microscope stage is manually movable in three orthogonal axial directions and two orthogonal rotational directions by corresponding motion transmission systems. Four of the transmission systems employ telescopic rods and a connecting pin having three resilient independently compressible sections. The pin transmits torques from one rod to the other about their longitudinal axes. One section is resiliently secured to an aperture in the inner rod, the other sections are resiliently secured to mating axial slots in the outer rod to permit relative axial displacement of the rods. The independent resilient compression of each section compensates for wear or differences in dimensions between mating surfaces while maintaining tight resilient torque coupling without backlash between the pin and the rods.

10 Claims, 9 Drawing Figures

MOTION TRANSMISSION SYSTEM

The present invention relates to a rotary motion transmission system in which the driven end tends to be linearly displaced relative to the driving end while transmitting the rotary motion, and more particularly, to a telescopic rotary motion transmission system.

A plurality of telescopic rotary motion transmission systems are employed to operate an electron microscope specimen stage. Such a stage includes a specimen platform which is required to be displaced in any of three orthogonal directions and rotated about one or more axes within a small increment, for example, a fraction of a micrometer or a fraction of an angular second, respectively. The microscope has a beam which may be about a micrometer or less in transverse width. The stage is employed to hold the specimen and locate the specimen in the beam. The microscope is part of a system which includes pumps and other machinery which tend to vibrate the stage somewhat. Also, the microscope system environment cannot tolerate contamination. The mechanisms of the stage therefore do not normally employ lubricants which might contaminate that environment. The vibrations and lack of lubrication tend to introduce problems in the stage operating mechanisms.

For example, each transmission system is required to move the platform in the selected orthogonal or rotational direction the desired amount while coupled to the other transmission systems without changing their respective stage settings. If backlash is present in any of the transmission systems, such backlash may permit a given system and the coupled stage to displace or be displaced in an unknown direction an unknown amount in the presence of the above vibrations. Such backlash also makes it extremely difficult to reposition the specimen in that microscope beam due to its small dimension. Because of lack of lubrication, prior art motion transmission systems employed in moving the above-described microscope stage may eventually exhibit backlash due to wear of the telescoping parts and thereby tend to undesirably permit the microscope stage to move in response to those vibrations.

In the motion transmission which employs a set of telescopic rods, a knob rotates the end of one rod whose other end is coupled to a displacement mechanism for moving the stage. When the stage is moved, the rods tend to telescopically change position, i.e, axially lengthen or foreshorten the spacing between the ends of the rod set.

A circular cylindrical pin in prior systems is located in a hole in one rod and in a pair of mating axial slots of the other rod, the hole, slots, and pin having a close fit to avoid backlash or play therebetween. The pin frictionally slides in the slots when the rods are moved axially relative to one another. The sliding action of the pin may wear the mating moving parts creating a loose fit and potential backlash therebetween. However, the present inventors believe even if the pin were not totally cylindrical, but a resilient split tubular element as shown in U.S. Pat. No. 4,549,182, The system could present wear, and, thus backlash problems. For example, the transverse slot widths in one rod should still exactly match the hole diameter of the other rod in which the element is inserted. If these dimensions do not match, as might occur due to wear or differences in manufacturing tolerances, then the hole or slot with the smaller dimension may inwardly compress the tube along its entire length to a transverse dimension smaller than that present in the mating larger opening and thus permit undesirable relative rotational movement, i.e., backlash, therebetween.

In a motion transmission system according to the present invention a pair of telescoping rods are adapted to displace relative to one another in an axial direction parallel to their length dimensions. A connector element is inserted in aligned openings in the rods for coupling the rods so that one rod rotating about its long axis rotates the other rod therewith in a given angular direction relative to the axis, permitting relative axial displacement between the rods. The connector element comprises means having negligible backlash coupling between the rods in response to a change in direction of the rotation of the rods. The means includes a plurality of spaced sections, at least one section corresponding to and engaged with at least one of the openings in one of the rods and at least one other section corresponding to and engaged with at least another of the openings in the other rod. The one section is secured to the one rod and so dimensioned that there is negligible relative displacement therebetween in the axial and in the given angular direction. The other rod and other section include means so dimensioned and adapted such that the other section is resiliently compressively secured to the other rod independent of the securing of the one section to the one rod to provide negligible relative angular displacement therebetween in response to a change in direction of rotation of the one rod regardless any change in the mating dimensions of the other rod and other section due to wear or other causes. The other section is adapted to be slidably frictionally engaged with the other rod in the axial direction for displacement in response to an axial directed force on one of the rods.

Figure 1:
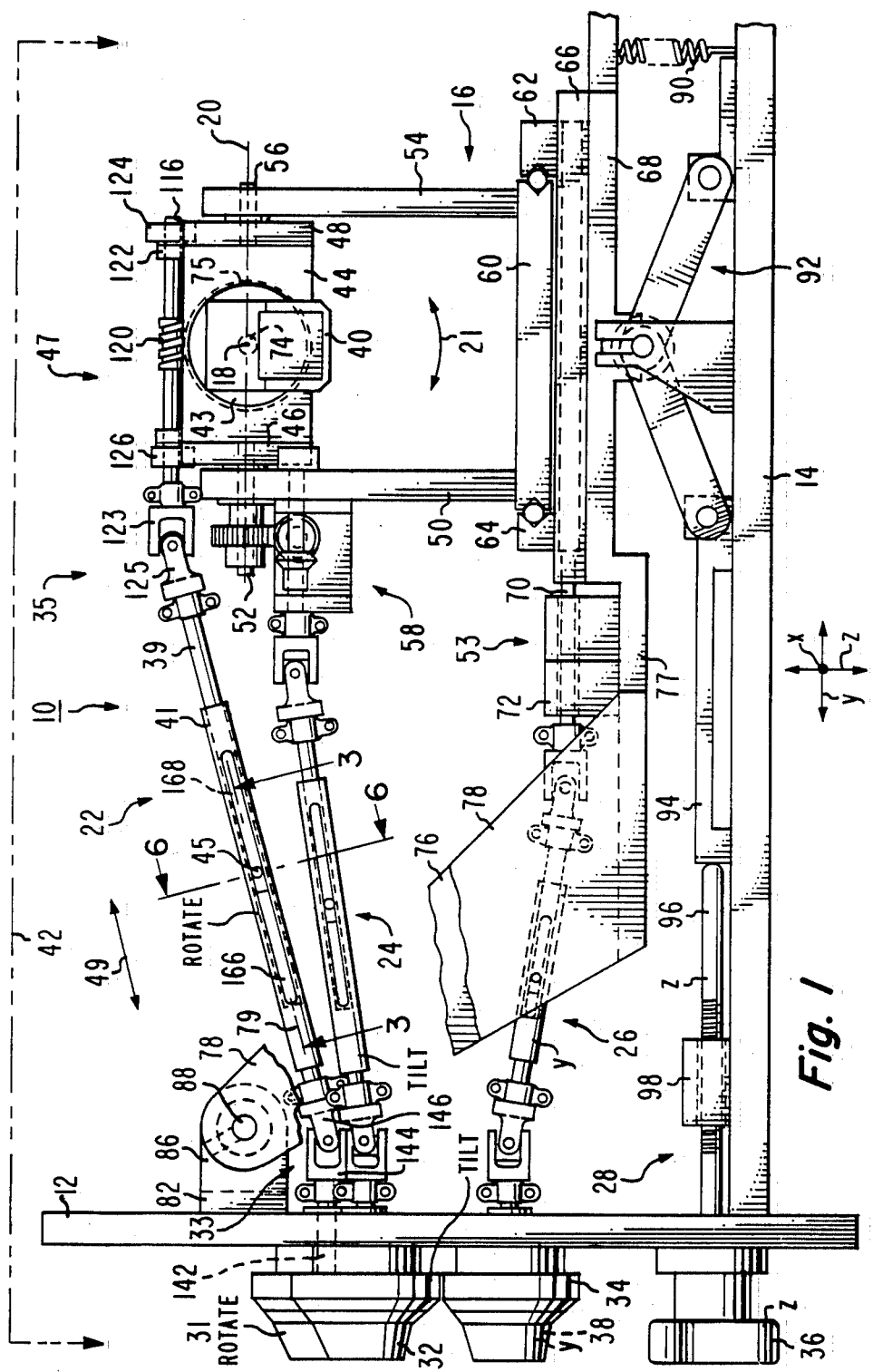
FIG. 1 is a sectional side elevation partially fragmented view of an apparatus according to one embodiment of the present invention.
Figure 3:
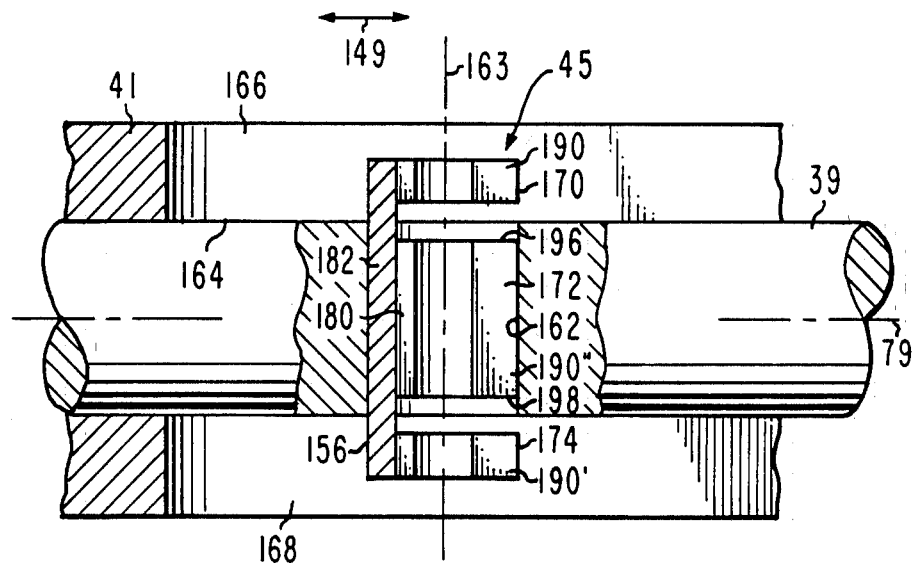
FIG. 3 is a sectional view showing, in more detail, the coupling device in one of the motion transmission systems of FIG. 1 taken along lines 3—3.
Figure 4A:
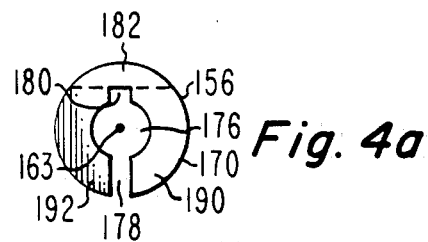
Figure 4B:
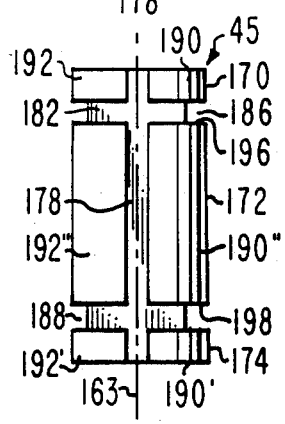
Figure 4C:
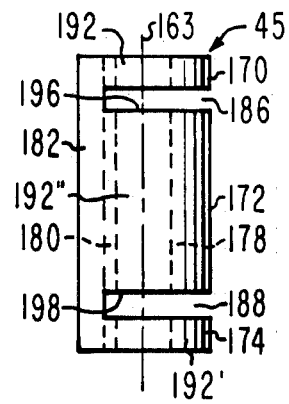
Figure 5A:
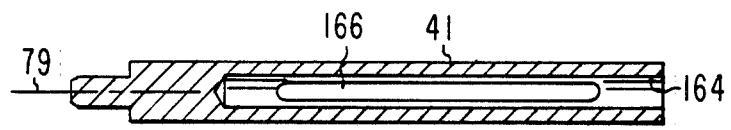
Figure 5B:
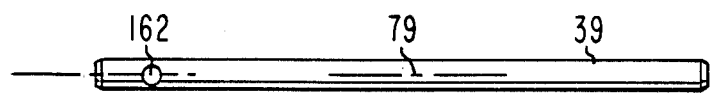
Figure 6:
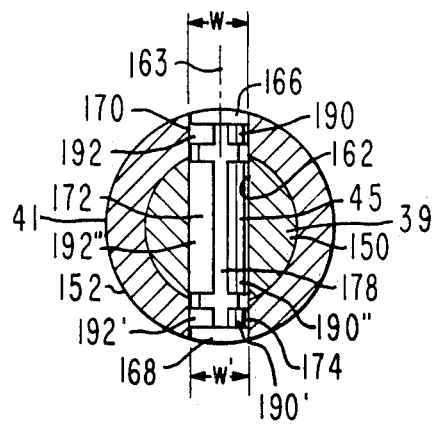

FIGS. 4a, 4b, and 4c are different views of the connector element employed in the embodiment of FIG. 3;

FIG. 5a is a sectional view of one rod of one transmission system of FIG. 1;

FIG. 5b is a side view of a rod which telescopically mates with the rod of FIG. 5a; and FIG. 6 is a sectional view of one motion transmission system of FIG. 1 taken along lines 6—6.

Figure 2:
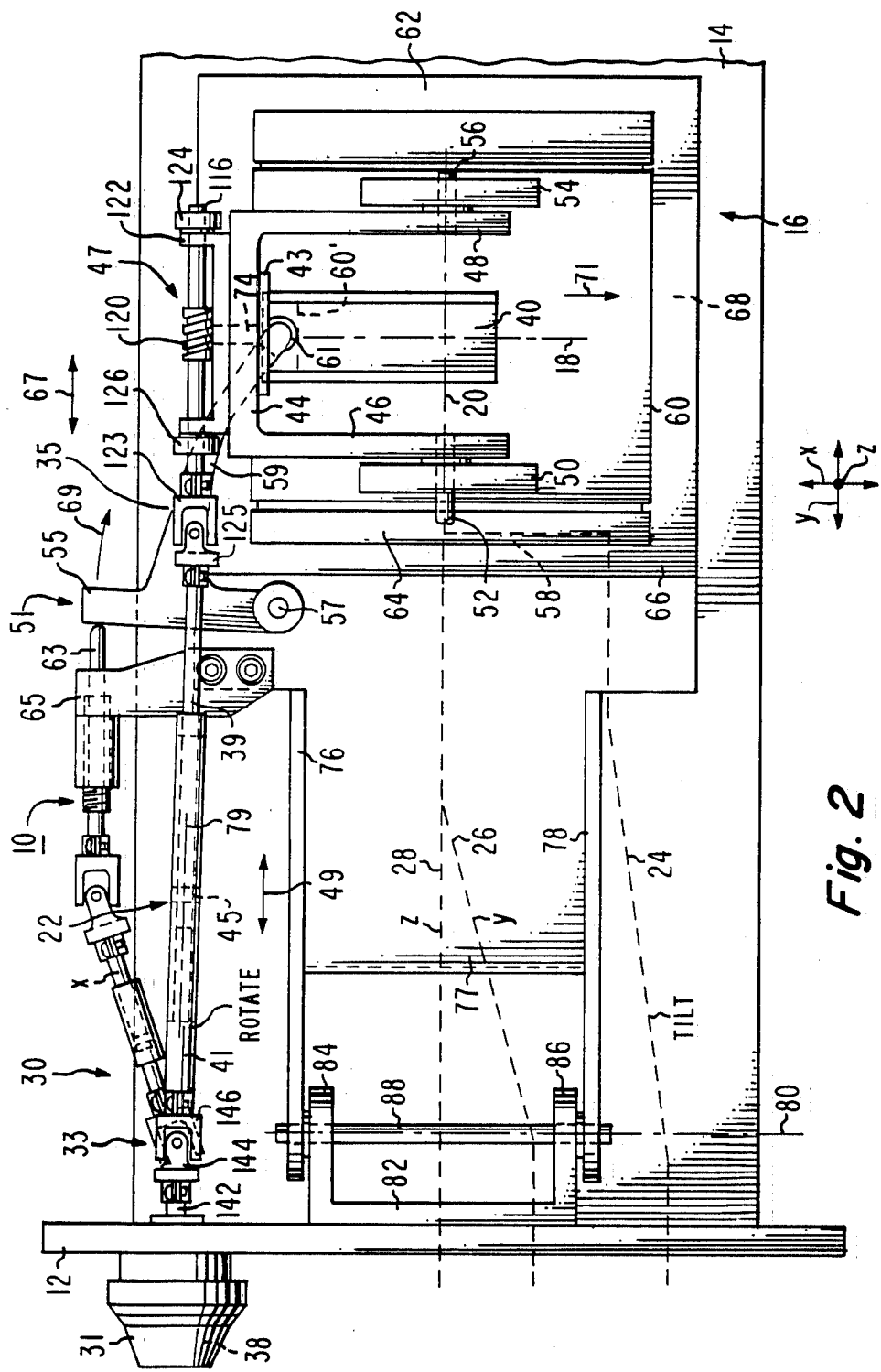
FIG. 2 is a sectional, fragmented, partially schematic plan view of the embodiment of FIG. 1.

In FIGS. 1 and 2, electron microscope apparatus 10 includes a housing comprising a front panel 12 and a base 14. Microscope stage assembly 16 is movably secured to the base 14 and to the panel 12 for displacement in three orthogonal linear directions x, y, and z, for rotation about a horizontal axis 18 parallel to the x directions and for rotation about horizontal axis 20 parallel to the y directions, the z directions being vertical. The stage assembly 16 can be moved in any of the aforementioned orthogonal or rotary directions with negligible affect on the position of the stage in the remaining directions. Motion transmission systems 22, 24, 26, 28, and 30, respectively move stage 40 in the rotational directions 21, FIG. 1, about axis 18, and in rotational directions about axis 20, and in the y, z, and x linear directions. The transmission systems also restrain the stage assembly from any displacement in the presence of vibrations transmitted to apparatus 10 by microscope 42, shown in phantom, coupled to assembly 16. In FIG. 2, the transmission systems 24, 26, and 28 are represented by dashed lines and in FIG. 1 transmission system 30 is not shown.

Each system 22–30 is rotatably secured at one end to the panel 12 for manual rotation by a corresponding knob and at the other driven end to stage assembly 16 via an appropriate coupling mechanism to displace the stage 40 or stage assembly 16 in the desired direction. Knob 31 drives system 22, knob 32 drives system 24, knob 34 drives system 26, knob 36 drives system 28, FIG. 1, and knob 38 drives system 30, FIG. 2. The knobs each include calibrations (not shown) for assisting in accurately moving the stage assembly 16 in small linear or angular increments. The other end of each system, in response to the rotation of the corresponding knob, imparts linear or rotational displacement of the stage 40 of the assembly 16 in the corresponding x, y, z or rotational directions. The transmission systems 22, 24, 26, and 30 are similar, embody the present invention, and, therefore, the description of the motion transmission system 22 is representative. Only so much of each system and of apparatus 10 is shown herein as is needed for an understanding of the present invention. Many components including sliders, gears, bearings, springs, screws, and other elements are neither shown nor described. The coupling mechanism for each transmission system to the stage assembly 16 differs because of the different motions imparted by the corresponding system.

Each transmission system 22, 24, 26, and 30 includes a pair of universal joints, one at each end and a telescopic motion transmission assembly connected between the joints for transmitting rotary motion of the corresponding knob to a particular stage assembly 16 displacement mechanism at the other end. For example, in system 22, knob 31 imparts rotary motion to joint 33 at one end. This rotates joint 35 at the other end via telescopic rods 39 and 41 and a rod connector element 45. Joint 35 operates a displacement mechanism comprising worm gear assembly 47 for rotating microscope stage 40 in directions 21 about axis 18, FIG. 1.

Because stage 40 can be displaced in any of the directions x, y, or z or rotated about axes 18 and 20, it can be readily observed that any one of those displacements can change the linear spacing between any pair of universal joints, such as joints 33 and 35 of system 22, of one or more of the transmission systems 22, 24, 26, and 30. Thus, the telescopic assembly of one or more systems may axially foreshorten or lengthen in response to a movement of stage 40 by any of the systems. That axial displacement may cause wear and change of mating dimensions of the rods, for example, rods 39 and 41 to the connector element, for example element 45, due to lack of lubricants. That change of dimensions due to wear should not loosen these parts for reasons given above. The present invention permits the rods to foreshorten or lengthen, e.g., directions 49, FIGS. 1 and 2, while accurately maintaining the relative angular position of the telescoping rods even in the presence of wear or manufactured differences in the mating dimensions of the rods and element.

In more detail, stage 40 supports a specimen to be examined by an electron beam (not shown) emitted by the microscope 42, the beam being emitted from a location vertically above assembly 16. Stage 40 is secured to one end of shaft 74 via disc 43. Shaft 74 is rotatably secured to plate 44, restrained from displacing relative to plate 44 in the x directions, and rotates about axis 18. Gear 75, FIG. 1, part of worm gear assembly 47, is secured to the other end of shaft 74. Trunnions 46 and 48 extend horizontally from plate 44, and are respectively rotatably secured to upstanding support 50 via drive shaft 52 and upstanding support 54 via idle shaft 56. Trunnions 46 and 48 are restrained from displacing in those y directions relative to supports 50 and 54 by means not shown. Shafts 52 and 56 rotate about axis 20, shaft 52 being coupled to the driven end of transmission system 24, FIG. 1, by gear and linkage assembly 58. Assembly 58 transmits the rotary motion of knob 32 via system 24 to stage 40, rotating drive shaft 52, plate 44, and the trunnions, and thus stage 40 about axis 20. This rotation is referred to as "tilt" in the drawing FIGS. 1 and 2.

Supports 50 and 54, FIG. 1, are secured to plate 60 which is slidably secured to ways 62 and 64, secured to plate 66, for displacement in the x directions relative to plate 66. Rotary motion of transmission system 30 operates lever assembly 51, FIG. 2, moving plate 60 in a selected x direction. Assembly 51 includes a crank lever 55 pinned to plate 66 by pin 57 for rotation about a vertical axis. Crank arm 59 extends from lever 55 and includes a roller 61 which rolls in contact with a vertical surface 60' of plate 60, FIG. 2. Push rod 63, rotatably driven by system 30, is threaded to block 65 secured to plate 66. Rotation of system 30 rotates rod 63 which linearly moves in one of directions 67. A displacement to the right, directions 67, pushes rod 63 against and rotates lever 55 in direction 69, pushing plate 60 and thus stage 40 in x direction 71.

A spring (not shown) pushes plate 60 against the roller 61 to resiliently force lever 51 against rod 63 to move stage 40 in an x direction opposite direction 71 when rod 63, FIG. 3, is moved to the left. This action necessarily displaces the stage assembly 16 including supports 50, 54 and plate 60 in the x directions relative to the ways 62, 64 and plate 66.

Plate 66, FIG. 1, is slidably secured to support assembly 68 by a set of ways (not shown) secured to assembly 68. Plate 66 moves in the y directions relative to assembly 68 in response to rotary motion of the transmission system 26 via push rod assembly 53. Assembly 53 includes a push rod 70 threaded to block 72 secured to plate 77 of assembly 68. Rotation of rod 70 in one direction forces it against plate 66 to the right in one of the y directions. A spring (not shown) forces plate 66 against shaft 70 to move plate 66 to the left in the other y direction when shaft 70 is displaced to the left.

The support assembly 68 includes a platform 77 attached to support arms 76 and 78 secured to shaft 88 for rotation about axis 80, FIG. 2. Bracket 82, secured to panel 12, has a pair of ears 84 and 86 rotatably supporting shaft 88. Platform 77 is pulled vertically toward base 14 by tension spring 90, FIG. 1. Scissor assembly 92 secured to base 14 lifts the platform in the vertical z direction in response to displacement of push rod 96 in the y direction to the right, FIG. 1.

System 28 displaces assembly 68 vertically and includes a push rod 96 threaded to block 98 secured to base 14. Rod 96 linearly displaces slider 94 in a y direction to the right when knob 36 is rotated in one direction. That rotation pushes slider 94 against scissor assembly 92 lifting assembly 68. The tension in spring 90 forces the assembly 68 and platform 77 down which pushes slider 94 to the left in the drawing figure in the other y direction when rod 96 displaces to the left in response to rotation of the knob in the other direction.

Transmission system 22, FIGS. 1 and 2, rotatably couples knob 31 to worm gear assembly 47. One end of rotatable shaft 142 of system 22, FIG. 2, is clamped to link 144 of joint 33 and the other shaft 142 end is secured to knob 31 through panel 12. Worm gear assembly 47 includes worm gear 120 engaged with gear 75, FIG. 1, which rotates about axis 18. Gear 120 is secured to and rotates with shaft 116 which is clamped to link 123 of universal joint 35, the other link 125 being clamped to rod 39. Shaft 116 is rotatably secured to bracket 122 fastened to plate 44. Collars 124, 126 lock shaft 116 to bracket 122. Worm gear 120 in response to rotation of system 22 rotates stage 40 about axis 18 relative to plate 44 and trunnions 46 and 48. This action is labelled "rotate" in FIGS. 1 and 2.

Element 45 couples rod 39 to rod 41, transmitting the rotation of drive rod 41 about common long axis 79 to the driven rod 39 without backlash. The element 45 permits telescopic lengthening and foreshortening of the combined rods 39, 41 in axial directions 49 without affecting the relative angular positions of the rods. The lengthening and foreshortening of the spacing between joints 33 and 35 may occur in response to a displacement of the stage assembly 16 in any of the x, y, z directions or in rotating about axes 18 and 20. It should be readily apparent by observation of the apparatus 10 of FIGS. 1 and 2 that such motions of the stage assembly 16 in response to operation of any of the motion transmission systems may change the linear spacing between universal joints 33 and 35 parallel to axis 79. That relative displacement of the rods 39, 41 must occur without upsetting or changing the relative angular positions of these rods to each other about axis 79 as set by knob 31. Otherwise stage 40 may change position in an unknown way in response to vibrations. Therefore, any backlash which otherwise might exist between the rods 39 and 41 and element 45 due to wear or variations in dimensions of the mating components is highly undesirable and could result in an undesirable change in position of the stage assembly 16. The same kind of backlash restriction is required for each of the remaining transmission systems coupling the stage assembly 16 to the front panel 12 because, as mentioned above, these systems are required to hold the position of stage 40 in the presence of vibrations and accurately position that stage in the order of a fraction of a micrometer or fraction of a second, as applicable.

The transmission systems 22, 24, 26, and 30 each include a pair of telescoping rods similar to rods 39, 41 and a coupling element similar to element 45 whose details will now be described. In FIG. 3, circular cylindrical rod 39 has a transverse circular cylindrical aperture 162 which passes through the rod intersecting the rod long axis 79. Aperture 162 long axis 163 is normal to axis 79. Rod 39 is closely slidably secured within an elongated mating circular cylindrical aperture 164 in tubular rod 41, the aperture 164 being concentric with axis 79. In FIGS. 3 and 5, rod 41 includes a pair of axially extending elongated slots 166 and 168 diametrically opposite each other. Slots 166 and 168 are the same length, are parallel to axis 79, and are sufficiently long to permit rod 39 to displace relative to rod 41 parallel to axis 79 in response to all possible permitted movements of the stage assembly 16, FIG. 1. Aperture 162 is aligned with slots 166 and 168.

In FIGS. 3 and 6, element 45 is resiliently received in aperture 162 and slots 166 and 168, and, by way of example, has a length greater than the diameter of rod 39 and smaller than the diameter of rod 41. Its length could be smaller or greater than that shown. In FIG. 4, element 45 comprises three transversely resilient sections 170, 172, and 174. In FIG. 3, section 170 is within slot 166, section 172 is within aperture 162 and section 174 is within slot 168. Each section is independently inwardly compressible by the walls of the mating slot or aperture to allow for wear and change in dimensions of the mating surfaces as will be explained shortly.

The element 45 may be formed from a tube of beryllium copper or other resilient relatively stiff material having a hollow circular cavity 176, FIG. 4a. In FIG. 4b, slot 178 extends end to end the length of the tube, splitting the tube wall in a plane parallel to and passing through axis 163 at a location opposite wall 182. A channel or groove 180 parallel to slot 178 is in wall 182. The slot 178 is parallel to axis 163. A slot 186 extends from the base of groove 180 at wall 182 to and in communication with slot 178 separating section 170 from section 172. A slot 188 identical and parallel to slot 186 also extends from the base of groove 180 to and in communication with slot 178, separating section 172 from section 174. Section 170 comprises two resilient opposed facing legs 190 and 192 which are parallel and identical to the legs 190' and 192' of section 174. Midsection 172 has legs 190" and 192" similar in shape to legs 190 and 192 in plan, FIG. 4a, but of greater axial length than the legs of sections 170, 174, FIGS. 4b and 4c.

In plan, FIG. 4a, the legs of the different sections are superimposed one over the other. The legs extend from a common base member 182 and are inwardly resilient and compressible generally toward axis 163. The legs of any section, such as section 170, can be inwardly compressed independently of the compression state of the legs of any of the other sections 172 and 174. That is, if the legs 190, 192 of section 170 were squeezed to reduce their outer diameter, such squeezing action would have no affect on the squeezed state of legs 190", 192" or legs 190', 192'. This is important to compensate for differences in sizes of the aperture 162 diameter and the widths of slots 166 and 168, FIG. 3, as might occur during manufacturing or due to wear of the mating surfaces. The reason for this independence is that compression of the legs 190, 192 inwardly would tend to bend the legs in a region between the base wall 182 and the legs' extended facing edges at slot 178. However, this inward compression induces relatively negligible distortion in the base wall 182 or in the other sections. Therefore, none of the forces involved in compressing legs 190, 192 are transmitted to the legs of the remaining sections.

The same action occurs regardless whether the legs of sections 172 or 174 are compressed inwardly. The inward bending of these sections is thus an action which is independent of bending of the legs of any other section. Each section resiliently adjusts automatically to the dimensions of the mating aperture or slot. It is important, therefore, to achieve such inward resilient compression that the free diameters of each section be greater than the diameter of aperture 162 and the widths of mating slots 166 and 168.

The element 45 is assembled into aperture 162 of rod 39, FIG. 3, with midsection 172 totally within aperture 162, section 170 engaged only with slot 166 and section 172 is engaged only with slot 168. This is to ensure each section corresponds to and is responsive only to the mating slot width or aperture diameter.

End surfaces 196, 198 of section 172 are so located in aperture 162 to provide clearance between section 172 and the rod 41 inner wall surface 164. Section 170, FIG. 3, is totally within the slot 166 and the sections 174 is totally within the slot 168. Thus, sections 170, 172, and 174 are each spaced from the interface between rods 39 and 41 at rod 41 wall 164, FIG. 3. The aperture 162 diameter is smaller than the free diameter of the section 172 to resiliently compress the legs 190″ and 192″ inwardly at all times. The transverse width of slots 166 and 168 are made smaller than the diameter of the element 45 mating sections so that each slot inwardly compresses the mating section. Because the aperture 162 is circular and the normal freestanding diameter of the element 45 is circular in plan as shown in FIG. 4a, the element 45 is resiliently restrained from significant displacement in any radial direction relative to rod 39 normal to axis 163. However, the resilient engagement of element 45 sections 170 and 172 with the mating respective slots 166 and 168 permits element 45 and rod 39 to displace axially relative to rod 41 parallel to axis 79. While each section is independently resilient, the element 45 is so constructed such that it is relatively stiff for transmitting torques about axis 79 from rod 39 to rod 41 with negligible bending of element 45 when rod 41 rotatably drives rod 39. That is, base wall 182 is made of a stiff material, e.g., beryllium copper, and is dimensioned to be sufficiently stiff to preclude bending of one section, e.g., 170, relative, to another section, e.g., 172, about axis 79 when transmitting rotary motions from one section to the other.

As best seen in FIG. 4a, each of the legs such as legs 190, 192 or 190′, 192′ or 190″, 192″ in the various sections extend from the base wall 182 such that each is compressible relative to axis 163 independently of the other legs of the other sections. This permits each section 170, 172, and 174 to be independently resiliently restrained in the corresponding slot 166, 168 or aperture 162 to compensate for any change in dimensions of between the mating surfaces. For example, in FIG. 6, assuming the slot 166 has a transverse width w of one dimension, the slot 168 during normal manufacturing may possibly have a transverse width w′ of a different dimension than slot 166. Further, the diameter of aperture 162 in rod 150 may be different from the transverse widths w and w′. Normally if a single integral split tubular member connected the rods 39 and 41 with the respective aperture and slots, that connection may result in the smallest slot width or aperture diameter compressing the entire length of the element uniformly. That compression would tend to create a relatively loose fit between the element and the larger of the slot widths and aperture. That looseness would be undesirable in a microscope adjustment system described hereinabove.

The sections 170 and 174 being resiliently inwardly compressed by the walls of respective slots 166 and 168, and section 172 being compressed by the wall of aperture 162, FIG. 3, transmits rotation forces imparted by rod 41 about axis 79 to rod 39. Because the element is in tight friction engagement with rod 39, such angular forces are transmitted to rod 41 without backlash or play regardless the relative rod axial positions.

In operation of the apparatus 10 of FIGS. 1 and 2, assume that the stage assembly 16 is positioned as shown. Suppose it is now desired to rotate the stage assembly about horizontal axis 18. Rotation of knob 31 rotates universal joint 33. This rotates rod 41 rotatably driving rod 39 in the same angular direction via connector element 45. Element 45 is relatively stiff and does not bend relative to axis 79 during this action. Shaft 116 rotates in response in the same direction, rotating worm gear 120. This action rotates gear 75, rotating stage 40 about axis 18 via shaft 74, FIG. 2. None of the other transmission systems were affected by this operation.

Assume that knob 32, FIG. 1, is rotated which rotates the transmission system 24 tilting stage assembly 16 rotating stage 40 about tilt axis 20. This action tilts joint 35 of the transmission system 22 and worm gear 120, its shafts and connecting system to stage 40 about axis 20. That tilting action of the transmission system about axis 20 tends to change the distance between the universal joint 35 relative to universal joint 33 of system 22. Rod 39 axially slides relative to rod 41. Some rotary motion may be imparted to rods 39 and 41 because of the rotation of joint 35 about axis 20 and the knob 31 setting accurately reflects that action due to the coupling of rods 39 and 41. However, gear 120 is not rotated relative to gear 75 by the tilting action. Thus, the position of stage 40 relative to axis 18 is not changed. If backlash were present between the rods as in prior art systems then such relative angular displacement of gear 75 might result in response to vibration of the system. This angular displacement is undesirable and is precluded by the transmission system of the present invention.

Assume now the knob 36 is rotated to move the stage assembly 16 in one of the z vertical directions, FIG. 1. It is plain that the vertical displacement of the stage assembly 16 may cause lengthening or foreshortening of each of the transmission systems 22, 24, 26, and 30 of FIGS. 1 and 2. These transmission systems each include the connector element 45 and mating coupling rods which may foreshorten or lengthen as described in connection with system 22 in response to that vertical displacement. This may cause wear of the mating parts. But due to their independent resilient coupling, different wear characteristics among those different parts has negligible effect on their continued interference fit. This precludes creating the undesirable backlash.

While the embodiment of FIGS. 3-6 illustrate two sections 170, 174 in engagement with corresponding slots in the outer rod 41 and a single section 172 in engagement with the inner rod 39, it is apparent that the functional relationships of these components may be reversed. For example, a slot corresponding to one of slots 166, 168 may be in the inner rod and one or more apertures corresponding to aperture 162 may be in the outer rod.

It is also apparent that in some implementations a single groove or aperture may be employed in the outer rod in conjunction with a corresponding groove or aperture in the inner rod. The important factor is that each section, such as sections 170, 172, 174 of the element 45, can be inwardly compressed independently of the remaining sections to accommodate a mating groove or aperture of different or changing dimensions. At the same time, tight resilient compressive friction engagement is maintained with that aperture or slot.

What is claimed is:

1. In combination:
   a first cylindrical rod;
   a second cylindrical rod having a hollow tubular section adapted to closely, slidably receive said first rod, at least one slot in one of said rods in communication with the other of said rods, the other of said rods having a transverse aperture in communication with said one slot; and
   a connecting pin for coupling said first and second rods with negligible rotary backlash, said pin comprising a hollow, semicircular element formed into at least two aligned spaced sections of a given cross-section, each section having a base wall integral with a base wall of the other section, and a pair of aligned cantilevered resilient legs extending from a corresponding base wall, one of said sections being resiliently, compressively engaged with said transverse aperture, the other section being resiliently compressively engaged with said at least one slot.

2. In a motion transmission system including a pair of telescoping rods, the inner rod including a transverse opening extending therethrough, the outer rod including a pair of opposed openings aligned with said transverse opening, the opening or openings in one of said rods extending a given distance along the length of that rod, a connecting element comprising three aligned, parallel spaced bifurcated independently resiliently compressible sections, each section depending from a given length of said element, one section being received in said transverse opening, a second section being received in one of said outer rod openings and the third section being received in the other of said outer rod openings, each said section being dimensioned for interference fit with the mating opening such that each section is resiliently compressed when so mated independently of the other sections in the presence of different transverse dimensions of said openings.

3. The system of claim 2 further including means coupled to one of said rods for imparting rotary motion to said one rod, and microscope stage means including means for permitting said stage means to be displaced in at least any of three orthogonal directions, said stage means including means coupled to the other of said rods and responsive to said rotary motion for displacing said stage means in one of said orthogonal directions.

4. The system of claim 3 further including a plurality of said motion transmission systems, each system, including means adapted to displace said stage means in a different one of said orthogonal directions.

5. A motion transmission system for transmitting rotary motion from one point to a second spaced point with negligible backlash while said points are displaced relative to each other in any direction comprising:
   a first rod having a first long axis and an aperture of a given diameter transverse said axis;
   a second rod having a second long axis parallel to the first axis and an elongated opening parallel to said axes adapted to slidably receive the first rod in telescopic spaced relation, said second rod including a pair of opposed parallel slots extending parallel to said elongated opening and aligned with said aperture, said slots each having a given transverse dimension; and
   a resilient connecting element having three spaced resiliently compressible sections aligned in a given direction forming a central section and two end sections, the central section being dimensioned to be compressively engaged with said first rod in said transverse aperture, one end section being dimensioned to be resiliently, compressively engaged with said second rod in one of said slots, the other end section being dimensioned to be resiliently, compressively engaged with said second rod in the other of said slots wherein said end sections slidably, frictionally engage said second rod, each said section being adapted for compression decoupled from the compression of the other sections.

6. The system of claim 5 further including universal joint means connected to the opposite extended ends of said first and second rods.

7. In a motion transmission system including a pair of telescoping rods adapted to displace relative to one another along their longitudinal axes and a connector element inserted in aligned transverse openings in said rods for coupling the rods so that rotation of one rod about its longitudinal axis rotates the other rod therewith in a given angular direction relative to said axis permitting said relative displacement, said connector element comprising means which provides substantially negligible backlash coupling between said rods in response to a change in direction of said rotation, said means including a plurality of spaced sections, at least one section corresponding to and engaged with at least one of said openings in one of said rods and at least one other section corresponding to and engaged with at least another of said openings in the other rod, the one section being secured to the one rod and so dimensioned that there is negligible relative displacement therebetween in said axial and given angular directions, the other rod and other section including means so dimensioned and adapted such that the other section is resiliently, compressively secured to the other rod independent of the securing of the one section to the one rod to provide negligible relative angular displacement therebetween in response to a change in direction of rotation of one rod regardless any change or difference in the mating dimensions of the other rod and other section due to wear or other causes, the other section being slidably, frictionally engaged with said other rod in said axial direction for displacement in response to an axially directed force on one of said rods.

8. The system of claim 7 wherein said element includes means such that each said sections are independently resiliently compressible, the one section being frictionally and resiliently compressibly secured to said one rod.

9. The system of claim 7 wherein said element comprises a hollow semicylindrical member having a slit extending through its wall parallel to the member's long axis, said member having first and second slots transverse to and in communication with said slit forming said member into three spaced compressible resilient sections, each slot having a depth such that each section is compressible independent of the other sections, two of said sections being coupled to and engaged with one of said rods.

10. The system of claim 7 wherein said rods are telescoping concentric circular cylinders, the inner of which receives and engages with said one section, the outer of said rods including diametrically opposite elongated openings extending in said axial direction, said element including first and second sections on respective opposite sides of said one section, the first section being engaged with the outer rod in one of said openings, the second section being engaged with the outer rod in the other of said openings, said first and second sections being independently resiliently compressively engaged with the outer rod in the corresponding opening.

* * * * *